US010969837B1

(12) United States Patent
Li et al.

(10) Patent No.: US 10,969,837 B1
(45) Date of Patent: Apr. 6, 2021

(54) HEAT SINK AND ELECTRONIC DEVICE HAVING SAME

(71) Applicant: HONGFUJIN PRECISION ELECTRONICS(TIANJIN)CO., LTD., Tianjin (CN)

(72) Inventors: Han-Yu Li, New Taipei (TW); Gong-Wen Zhang, Tianjin (CN); Fang-Xing Yang, Tianjin (CN); Xiang-Jie Chen, Tianjin (CN); Jin-Xing Zhang, Tianjin (CN)

(73) Assignee: HONGFUJIN PRECISION ELECTRONICS(TIANJIN)CO., LTD., Tianjin (CN)

( * ) Notice: Subject to any disclaimer, the term of this patent is extended or adjusted under 35 U.S.C. 154(b) by 0 days.

(21) Appl. No.: 16/697,612

(22) Filed: Nov. 27, 2019

(30) Foreign Application Priority Data

Nov. 6, 2019  (CN) .......................... 201911078470.9

(51) Int. Cl.
*G06F 1/20* (2006.01)
*F28D 15/02* (2006.01)
(Continued)

(52) U.S. Cl.
CPC ............. *G06F 1/20* (2013.01); *F28D 15/025* (2013.01); *F28D 15/0266* (2013.01);
(Continued)

(58) Field of Classification Search
CPC . H05K 7/2029; H05K 7/20309–20327; H05K 7/20409; H05K 7/20663–20709;
(Continued)

(56) References Cited

U.S. PATENT DOCUMENTS

| 4,393,663 | A | * | 7/1983 | Grunes | ................ F28D 15/0266 |
|   |   |   |   |   | 165/104.21 |
| 5,737,923 | A | * | 4/1998 | Gilley | ................... F28F 13/187 |
|   |   |   |   |   | 62/3.7 |

(Continued)

FOREIGN PATENT DOCUMENTS

| JP | 2019132514 A | * | 8/2019 | .......... H01M 10/652 |
| TW | M410448 U1 |   | 8/2011 | |

OTHER PUBLICATIONS

Koji MIUra, Temperatuer Control Device, Aug. 2019, Denso Corporation (Year: 2019).*

*Primary Examiner* — Robert J Hoffberg
*Assistant Examiner* — Amir A Jalali
(74) *Attorney, Agent, or Firm* — ScienBiziP, P.C.

(57) ABSTRACT

A loop thermosiphon (LTS) heat sink includes an evaporator, a condenser, a gas conduit, and a liquid conduit. The evaporator includes a first surface, a second surface opposite to the first surface, and a third surface coupled between the first surface and the second surface. Each of the first surface and the second surface is configured to mount a heat generating component. One end of the gas conduit is coupled to one end of the liquid conduit, and another end of the gas conduit and another end of the liquid conduit are coupled to the evaporator through the third surface. The evaporator, the gas conduit, and the liquid conduit cooperatively form a circulation passage. A connecting portion of the gas conduit and the liquid conduit is received within the condenser.

12 Claims, 5 Drawing Sheets

(51) Int. Cl.
*H05K 7/20* (2006.01)
*H01L 23/427* (2006.01)
*H05K 1/02* (2006.01)

(52) U.S. Cl.
CPC ......... *H01L 23/427* (2013.01); *H05K 1/0203* (2013.01); *H05K 7/20309* (2013.01); *H05K 7/20318* (2013.01); *H05K 7/20327* (2013.01); *H05K 7/20409* (2013.01)

(58) Field of Classification Search
CPC .. H05K 7/20881; H05K 7/20936; G06F 1/20; G06F 1/203; G06F 2200/201; F28D 15/025; F28D 15/0266; F28D 15/0275; F28D 15/02; F28D 15/233; H01L 23/46; H01L 23/473

USPC .......... 361/699–703, 679.53; 165/80.4–80.5, 165/104.33; 62/259.2

See application file for complete search history.

(56) References Cited

U.S. PATENT DOCUMENTS

| | | | | |
|---|---|---|---|---|
| 6,834,713 | B2* | 12/2004 | Ghosh | F28D 15/0266 |
| | | | | 165/104.21 |
| 7,958,935 | B2* | 6/2011 | Belits | F28F 3/12 |
| | | | | 165/104.21 |
| 9,423,192 | B2* | 8/2016 | Tsoi | F28F 21/084 |
| 9,463,536 | B2* | 10/2016 | Rice | B23P 15/26 |
| 2010/0188818 | A1* | 7/2010 | Li | H01L 23/427 |
| | | | | 361/700 |
| 2014/0071629 | A1* | 3/2014 | Habert | H01L 23/4012 |
| | | | | 361/701 |
| 2014/0318167 | A1* | 10/2014 | Uchida | F28D 15/04 |
| | | | | 62/259.2 |
| 2015/0129175 | A1* | 5/2015 | Huang | F28D 15/04 |
| | | | | 165/104.21 |
| 2015/0354901 | A1* | 12/2015 | Moore | F28D 15/0275 |
| | | | | 165/104.21 |
| 2016/0245593 | A1* | 8/2016 | Rice | F28D 15/0233 |
| 2018/0023594 | A1* | 1/2018 | Sheng | F04D 1/06 |
| | | | | 165/104.31 |
| 2018/0063994 | A1* | 3/2018 | Wu | H05K 7/20309 |
| 2019/0178583 | A1* | 6/2019 | Chen | F28D 1/0226 |
| 2020/0015387 | A1* | 1/2020 | Farshchian | H05K 57/20818 |
| 2020/0203255 | A1* | 6/2020 | Tschida | H02H 9/044 |
| 2020/0217595 | A1* | 7/2020 | Wu | F28D 15/0266 |

* cited by examiner

# HEAT SINK AND ELECTRONIC DEVICE HAVING SAME

FIELD

The subject matter herein generally relates to heat sinks, and more particularly to a heat sink capable of dissipating heat of multiple heat generating components of an electronic device.

BACKGROUND

Generally, heat sinks are used for dissipating heat generated by components of an electronic device. When the heat generating components are image processing units (GPUs), the related art generally uses loop thermosiphon (LTS) heat sinks. However, one LTS heat sink is required for each GPU to dissipate heat generated by the GPU, which takes up space.

BRIEF DESCRIPTION OF THE DRAWINGS

Implementations of the present disclosure will now be described, by way of embodiments, with reference to the attached figures.

DETAILED DESCRIPTION

Figure 1:
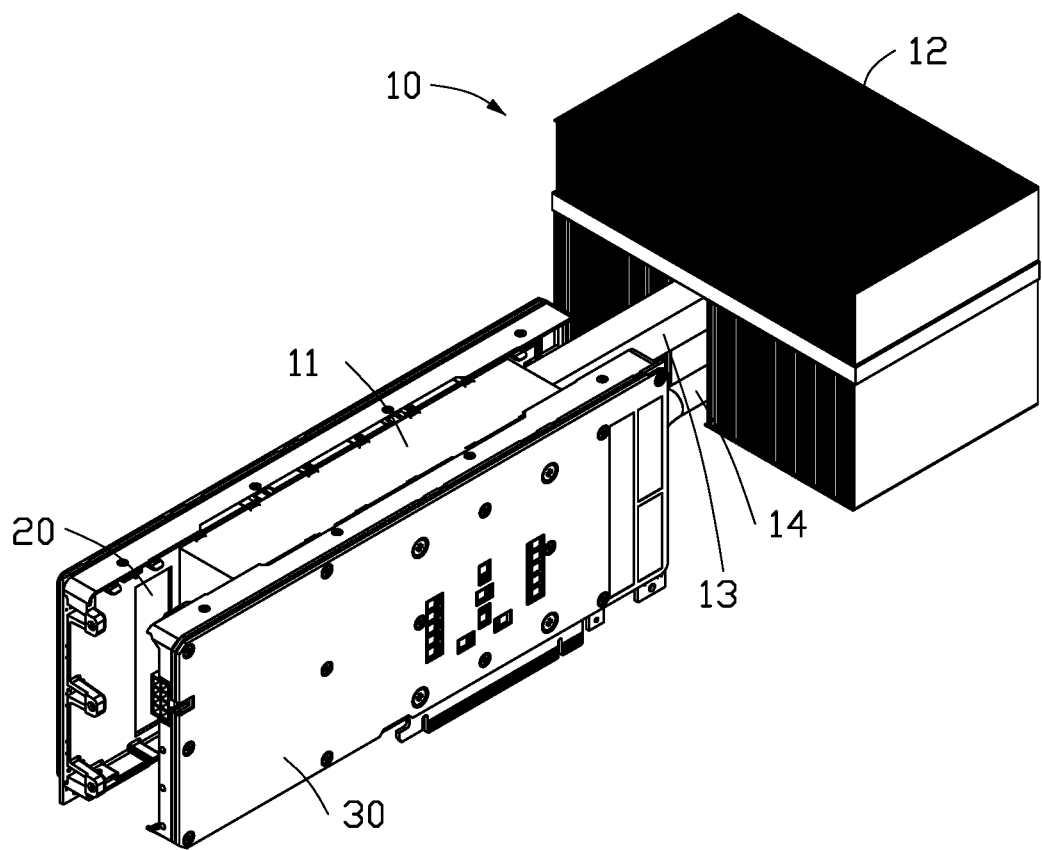
FIG. 1 is an assembled, isometric view of an embodiment of a loop thermosiphon (LTS) heat sink.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

Figure 2:
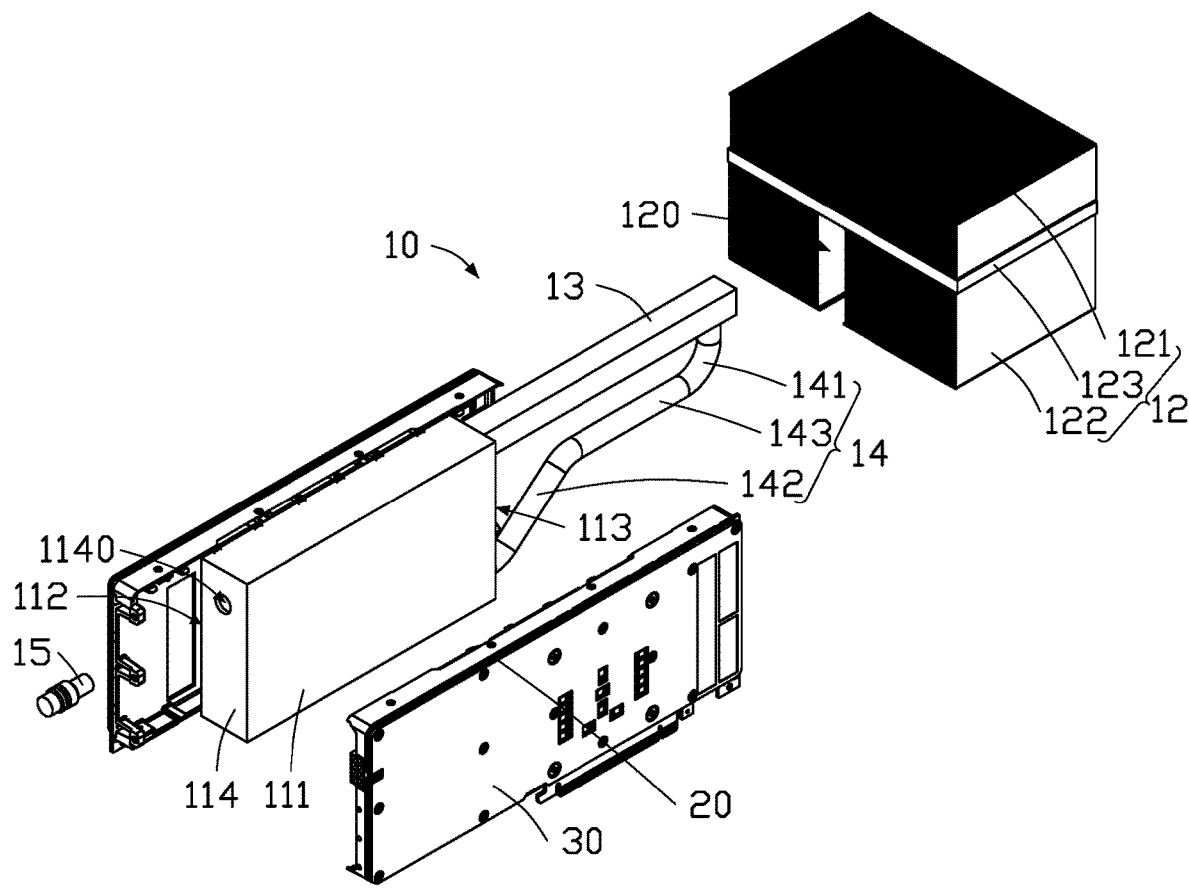
FIG. 2 is an exploded, isometric view of the LTS heat sink in FIG. 1.

FIGS. 1-2 show an embodiment of a LTS heat sink 10. The LTS heat sink 10 includes an evaporator 11, a condenser 12, a gas conduit 13, and a liquid conduit 14. The gas conduit 13 is located above the liquid conduit 14. One end of the gas conduit 13 is connected to one end of the liquid conduit 14, and another end of the gas conduit 13 and another end of the liquid conduit 14 are connected to the evaporator 11. A circulation passage is formed by the evaporator 11, the gas conduit 13, and the liquid conduit 14. The one end of the gas conduit 13 and the one end of the liquid conduit 14 are connected to each other in the condenser 12.

The evaporator 11 includes at least a first surface 111, a second surface 112, and a third surface 113. The first surface 111 and the second surface 112 are located opposite to each other, and the third surface 113 is connected between the first surface 111 and the second surface 112. The first surface 111 and the second surface 112 respectively fix a heat generating component 20. The another end of the gas conduit 13 and the another end of the liquid conduit 14 are connected to the evaporator 11 from the third surface 113.

In one embodiment, the heat generating component 20 is an image processor (GPU), and two of the GPUs are respectively mounted on the first surface 111 and the second surface 112 of the evaporator 11 by a fixing frame 30. A cooling medium is received in the circulation passage. In operation, heat generated by the two of the heat generating components 20 is transmitted to the evaporator 11 through the first surface 111 and the second surface 112, respectively, and the cooling medium in the evaporator 11 is evaporated into a gas. The gas carries heat into the gas conduit 13. After the gas enters the condenser 12 through the gas conduit 13, the heat is dissipated, the gas condenses into a liquid, the liquid flows into the liquid conduit 14 under an action of gravity, and then returns to the evaporator 11, and the cycle is repeated.

In one embodiment, the condenser 12 is provided with a receiving groove 120 for receiving a connecting end of the gas conduit 13 and the liquid conduit 14. The condenser 12 includes a fin mounting set and a fin mounting plate 123. The fin mounting set is composed of a plurality of upper fins 121 and a plurality of lower fins 122. The fin mounting plate 123 serves as a condensing plate. The plurality of upper fins 121 is mounted side by side on an upper surface of the fin mounting plate 123, and the plurality of lower fins 122 is mounted side by side on a lower surface of the fin mounting plate 123. During operation, heat is transferred to air through the plurality of upper fins 121 and the plurality of lower fins 122 for heat dissipation.

Figure 3:
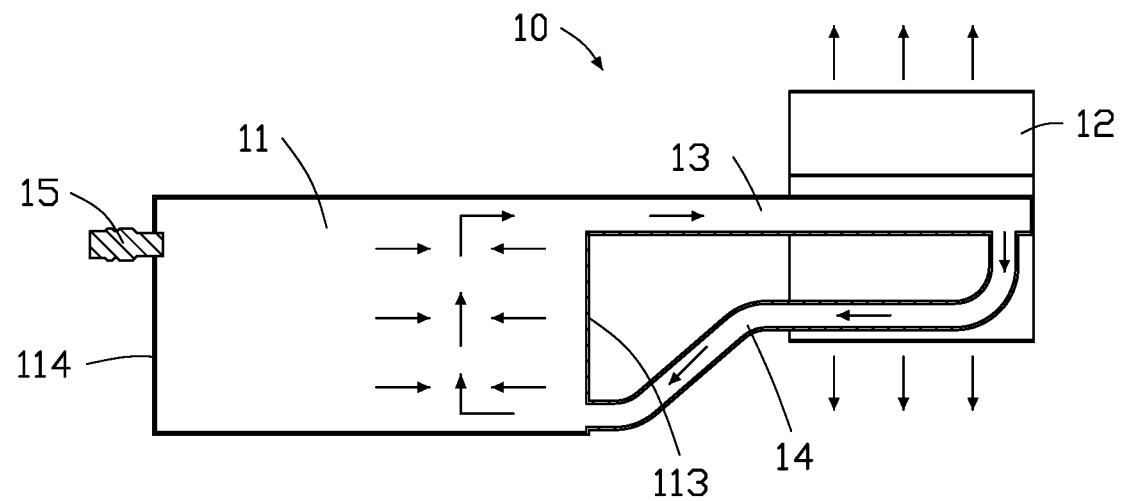
FIG. 3 is a diagram of flow of one embodiment of a circulation passage formed by a condenser, a gas conduit, and a liquid conduit of the LTS heat sink.

Referring to FIG. 3, in one embodiment, the gas conduit 13 and the liquid conduit 14 are directly connected, and a connecting portion of the one end of the liquid conduit 14 and the one end of the gas conduit 13 is located on the lower surface of the fin mounting plate 123. The gas in the gas conduit 13 is liquefied by contact with the lower surface of the fin mounting plate 123, and then the liquid flows into the liquid conduit 14 under the action of gravity.

Figure 4:
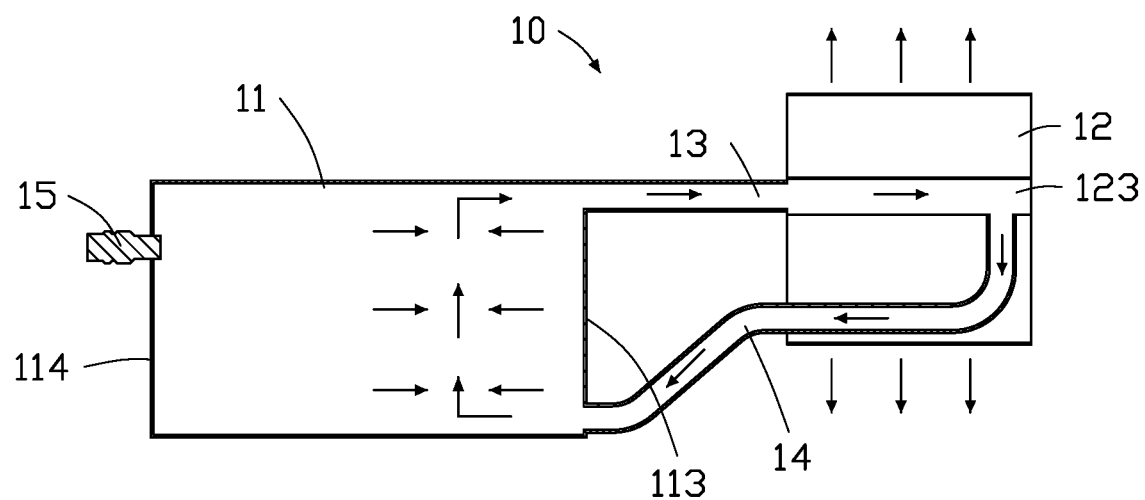
FIG. 4 is a diagram of flow of another embodiment of the circulation passage.

Referring to FIG. 4, in another embodiment, the gas conduit 13 and the liquid conduit 14 may be connected through the fin mounting plate 123. Specifically, the one end of the gas conduit 13 is connected to a side surface of the fin mounting plate 123, and the one end of the liquid conduit 14 is connected to the lower surface of the fin mounting plate 123. Thus, the gas in the gas conduit 13 flows into the fin mounting plate 123 and is liquefied in the fin mounting plate 123, and then the liquid flows into the liquid conduit 14 under the action of gravity.

It should be understood that a length of the gas conduit 13 and a length of the liquid conduit 14, a distance between the evaporator 11 and the condenser 12, a number and a length of the upper fins 121, and a number and a length of the lower fins 122 can be adjusted according to actual needs.

In one embodiment, the evaporator 11 further includes a fourth surface 114 connected between the first surface 111 and the second surface 112 and located opposite to the third surface 113. The fourth surface 114 is provided with an opening 1140 for filling the circulation passage with the cooling medium, such as water, alcohol, or the like. The LTS heat sink 10 further includes a filling valve 15 detachably mounted in the opening 1140 for plugging the opening 1140.

In one embodiment, the liquid conduit 14 includes a drainage section 141, a guiding section 142, and a connecting section 143. The connecting section 143 is connected to the drainage section 141 and the guiding section 142. The drainage section 141 is connected to the gas conduit 13, and the guiding section 142 is connected to the evaporator 11. The drainage section 141 may be vertically disposed, the connecting section 143 may be horizontally disposed, and the guiding section 142 may be obliquely disposed, such that one end of the guiding section 142 connected to the connecting section 143 is higher than another end of the guiding section 142 connected to the evaporator 11.

Figure 5:
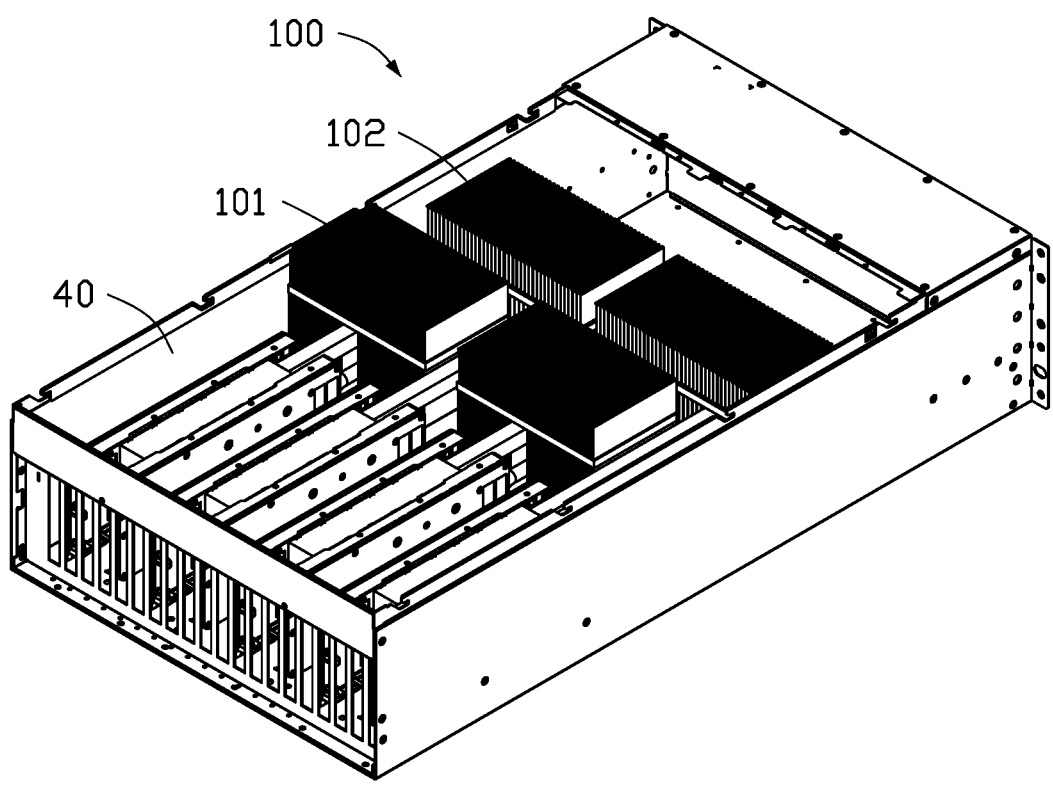
FIG. 5 is an assembled, isometric diagram of an embodiment of an electronic device having at least two LTS heat sinks.

Referring to FIG. 5, an electronic device 100 includes a housing 40, a plurality of the LTS heat sinks 10 received in the housing 40, and a plurality of the heat generating components 20 received in the housing 40. It should be understood that other components of the electronic device 100 which are not described herein may be received in the housing 40.

In one embodiment, the electronic device 100 is provided with eight of the GPUs and four of the LTS heat sinks 10, such that each of the LTS heat sinks 10 simultaneously dissipates heat for two of the GPUs.

In one embodiment, four of the LTS heat sinks 10 are composed of two first LTS heat sinks 101 and two second LTS heat sinks 102. The evaporators 11 of the four of the LTS heat sinks 10 are arranged side by side, the condensers 12 of the two first LTS heat sinks 101 are arranged side by side, and the condensers 12 of the two second LTS heat sinks 102 are arranged side by side. A distance between the evaporator 11 and the condenser 12 of the two first LTS heat sinks 101 is less than a distance between the evaporator 11 and the condenser 12 of the two second LTS heat sinks 102. A number of fins of the two first LTS heat sinks 101 is less than a number of fins of the two second LTS heat sinks 102.

Compared with the related art, each of the LTS heat sinks 10 can dissipate heat from two of the heat generating components 20 simultaneously, thereby reducing a required mounting space of the LTS heat sinks 10 in the electronic device 100.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A loop thermosiphon (LTS) heat sink comprising:
an evaporator comprising a first surface, a second surface opposite to the first surface, and a third surface coupled between the first surface and the second surface, each of the first surface and the second surface is mounted to a respective heat generating component;
a condenser;
a gas conduit; and
a liquid conduit; wherein:
one end of the gas conduit is coupled to one end of the liquid conduit, and another end of the gas conduit and another end of the liquid conduit are coupled to the evaporator through the third surface;
the evaporator, the gas conduit, and the liquid conduit cooperatively form a circulation passage; and the one end of the gas conduit and the one end of the liquid conduit are connected within the condenser; and
a filing valve, wherein:
the evaporator further comprises a fourth surface coupled between the first surface and the second surface and located opposite to third surface;
the fourth surface defines an opening;
the filling valve is detachably mounted in the opening and configured to plug the opening.

2. The LTS heat sink of claim 1, wherein:
the gas conduit is arranged above the liquid conduit.

3. The LTS heat sink of claim 2, wherein:
the liquid conduit comprises a drainage section, a guiding section, and a connecting section;
the connecting section is coupled to the drainage section and the guiding section;
the drainage section is coupled to the gas conduit;
the guiding section is coupled to the evaporator;
the drainage section is vertically disposed, the connecting section is horizontally disposed, and the guiding section is obliquely disposed;
one end of the guiding section coupled to the connecting section is higher than another end of the guiding section coupled to the evaporator.

4. The LTS heat sink of claim 1, wherein:
the condenser further comprises a fin mounting plate and a fin mounting set;
the fin mounting set is provided with a receiving groove; and
the one end of the gas conduit and the one end of the liquid conduit are received in the receiving groove.

5. The LTS heat sink of claim 4, wherein:
the gas conduit is directly coupled to the liquid conduit, and the one end of the gas conduit and the one end of the liquid conduit are received in the receiving groove under the fin mounting plate.

6. The LTS heat sink of claim 4, wherein:
the gas conduit is coupled to the liquid conduit through the fin mounting plate;
the one end of the gas conduit is coupled to a side of the fin mounting plate; and
the one end of the liquid conduit is coupled to a lower surface of the fin mounting plate.

7. An electronic device comprising:
a housing;
at least two heat generating components mounted in the housing; and
a loop thermosiphon (LTS) heat sink mounted in the housing, wherein:
the LTS heat sink comprises an evaporator, a condenser, a gas conduit, and a liquid conduit;
the evaporator comprises a first surface, a second surface opposite to the first surface, and a third surface coupled between the first surface and the second surface, the at least two heat generating components respectively mounted on the first surface and the second surface;

one end of the gas conduit is coupled to one end of the liquid conduit, and another end of the gas conduit and another end of the liquid conduit are coupled to the evaporator through the third surface;

the evaporator, the gas conduit, and the liquid conduit cooperatively form a circulation passage; and the one end of the gas conduit and the one end of the liquid conduit are received within the condenser; and the LTS heat sink further comprises a filling valve;

the evaporator further comprises a fourth surface coupled between the first surface and the second surface and located opposite to the third surface;

the fourth surface defines an opening;

the filling valve is detachably mounted in the opening and configured to plug the opening.

8. The electronic device of claim 7, wherein:

the gas conduit is arranged above the liquid conduit.

9. The electronic device of claim 8, wherein:

the liquid conduit comprises a drainage section, a guiding section, and a connecting section;

the connecting section is coupled to the drainage section and the guiding section;

the drainage section is coupled to the gas conduit;

the guiding section is coupled to the evaporator;

the drainage section is vertically disposed, the connecting section is horizontally disposed, and the guiding section is obliquely disposed;

one end of the guiding section coupled to the connecting section is higher than another end of the guiding section coupled to the evaporator.

10. The electronic device of claim 7, wherein:

the condenser further comprises a fin mounting plate and a fin mounting set;

the fin mounting set is provided with a receiving groove; and the one end of the gas conduit and the one end of the liquid conduit are received in the receiving groove.

11. The electronic device of claim 10, wherein:

the gas conduit is directly coupled to the liquid conduit, and the one end of the gas conduit and the one end of the liquid conduit are received in the receiving groove under the fin mounting plate.

12. The electronic device of claim 10, wherein:

the gas conduit is coupled to the liquid conduit through the fin mounting plate;

the gas conduit is coupled to a side of the fin mounting plate; and the liquid conduit is coupled to a lower surface of the fin mounting plate.

\* \* \* \* \*